US007298163B2

(12) United States Patent
Takada

(10) Patent No.: US 7,298,163 B2
(45) Date of Patent: Nov. 20, 2007

(54) TFT ARRAY INSPECTION DEVICE

(75) Inventor: Chikuya Takada, Tokyo (JP)

(73) Assignee: Shimadzu Corporation, Kyoto (JP)

( * ) Notice: Subject to any disclaimer, the term of this patent is extended or adjusted under 35 U.S.C. 154(b) by 315 days.

(21) Appl. No.: 10/834,874

(22) Filed: Apr. 30, 2004

(65) Prior Publication Data

US 2004/0246018 A1 Dec. 9, 2004

(30) Foreign Application Priority Data

Jun. 6, 2003 (JP) ............................. 2003-162018

(51) Int. Cl.
*G01R 31/00* (2006.01)
*G01R 31/305* (2006.01)
*G01R 1/04* (2006.01)

(52) U.S. Cl. ........................ 324/770; 324/758; 250/310

(58) Field of Classification Search ................. 324/770
See application file for complete search history.

(56) References Cited

U.S. PATENT DOCUMENTS 6,137,300 A * 10/2000 Hayashida .................. 324/758
6,750,926 B2 * 6/2004 Ohgiichi et al. .............. 349/40
6,759,867 B2 * 7/2004 Sohn .......................... 324/770
6,765,203 B1 * 7/2004 Abel .......................... 250/310

* cited by examiner

*Primary Examiner*—Ha Tran Nguyen
*Assistant Examiner*—Emily Y Chan
(74) *Attorney, Agent, or Firm*—Manabu Kanesaka

(57) ABSTRACT

A TFT array inspection device inspects a TFT array substrate having thin film transistors arranged in a matrix pattern. The TFT array inspection device includes a probe frame to be electrically connected to the TFT array substrate. The probe frame includes probe pins contacting array inspection electrodes to be connected to a driving electrode terminal provided in a TFT array on the TFT array substrate through wires. The probe pins are positioned at common locations relative to a layout of the TFT array substrate. Since the probe pins are located at common positions, it is possible to use a single common probe frame for the TFT array substrate with a different layout without providing or changing a prove frame corresponding to a different layout of the TFT array substrate.

6 Claims, 11 Drawing Sheets

TFT ARRAY INSPECTION DEVICE

BACKGROUND OF THE INVENTION AND RELATED ART STATEMENT

The present invention relates to a thin film transistor (hereinafter referred to as TFT) array inspection device for inspecting a TFT array substrate used for a liquid crystal display, an organic EL display, and the like.

A TFT array substrate is formed of thin film transistors arranged in a matrix pattern and a signal electrode for supplying a driving signal to the thin film transistors. FIG. 11 is a view showing the TFT array substrate and a conventional TFT array inspection device. In FIG. 11, a TFT array substrate 12 includes a plurality of TFT arrays 12*a* on a substrate formed of glass and the like. Each of the TFT arrays 12*a* includes a plurality of thin film transistors (not shown) arranged in a matrix pattern. The thin film transistors are driven by a signal from scanning signal electrode terminals 12*b* and image signal electrode terminals 12*c*.

A TFT array inspection device 11 inspects the TFT arrays 12*a* on the TFT array substrate 12. The TFT array inspection device 11 includes inspecting probe electrodes 11*b*-1 and 11*b*-2 electrically connected to the scanning signal electrode terminals 12*b* and the image signal electrode terminals 12*c*, and an inspecting circuit 11*c*. The inspecting circuit 11*c* includes voltage supply means and detection means. The voltage supply means applies a predetermined voltage, and the detection means detects an electric current to inspect a short circuit between a gate and a source, a point defect, a breaking, and the like. Japanese Patent Publication (Kokai) No. 2001-272643 has disclosed such a TFT array inspection device.

The TFT array is used as, for example, a liquid crystal panel. Various TFT arrays with various sizes and specifications are arranged on a. TFT array substrate. Accordingly, each of the TFT array substrates has different driving electrodes depending on a layout thereof.

In the conventional TFT array inspection device, it is necessary to provide an inspecting probe electrode having a specific electrode arrangement according to a layout of the TFT array. It is also necessary to change the inspecting probe electrode according to the TFT array substrate to be inspected, thereby taking time for the inspection. Also, when the layout of the TFT array is changed, it is necessary to change the inspecting probe electrode of the TFT array inspection device, thereby increasing cost.

As a substitute for the TFT array inspection device, there has been proposed an inspection method in which a probe frame is provided with probe pins contacting all of the electrodes of the TFT arrays arranged on the TFT array substrate. However, in such a probe frame, similar to the TFT array inspection device described above, it is still necessary to provide the probe frame corresponding to an arrangement of electrodes when the layout of the TFT array is changed.

In view of the problems described above, the present invention has been made, and an object of the present invention is to provide a TFT array inspection device using a common member without changing a member according to a different layout of the TFT array substrate.

Further objects and advantages of the invention will be apparent from the following description of the invention.

SUMMARY OF INVENTION

In order to achieve the objects described above, according to an embodiment of the present invention, a TFT array inspection device is provided with a common probe frame corresponding to different layouts of the TFT array substrates. Accordingly, it is not necessary to change the probe frame according to a layout of a TFT array substrate.

More specifically, according to the embodiment of the present invention, the TFT array inspection device inspects a TFT array substrate having thin film transistors arranged in a matrix pattern. The TFT array inspection device includes a probe frame to be electrically connected to the TFT array substrate. The probe frame includes a probe pin contacting an array inspection electrode to be connected to a driving electrode terminal provided in a TFT array on the TFT array substrate through a wire. The probe pin is positioned at a common location relative to a layout of the TFT array substrate. Since the probe pin is located at a same position, it is possible to use a single common probe frame for the TFT array substrate with a different layout without providing or changing a prove frame corresponding to a different layout of the TFT array substrate.

In the embodiment of the present invention, the TFT array inspection device may include connecting means for detachably connecting the probe frame and an external device so that the TFT array inspection device is electrically connected to the external device through the probe frame. The connecting means may include switching means for switching an arrangement of the connection between the probe pin and the external device.

Accordingly, the TFT array is electrically connected to the external device through the probe frame and the connecting means. A driving voltage is applied to the TFT array, and the external device detects a detection signal from the TFT array. The connecting means is freely removable, so that when the TFT array substrate to be inspected is changed, it is easy to switch the connection of the probe frame.

The switching means may include a connection switching connector or a switching element. The connection switching connector defines a connection between an electrode connected to the probe pin and an electrode connected to the external device according to a layout of the TFT array substrate. Through changing the connection switching connector, it is possible to obtain a desirable electrical connection between the TFT array substrate with a different layout and the external device.

In a configuration using the switching element, it is possible to switch a connection between an electrode connected to the probe pin and an electrode connected to the external device with the switching element through an external control signal. Accordingly, it is possible to obtain a desirable electrical connection between the TFT array substrate with a different layout and the external device.

The external device may include a power unit for supplying a voltage for driving the TFT array; detection means for detecting a signal of the TFT array; and inspection means for inspecting a short circuit, a point defect, a breakage, and the like of the TFT array based on a detection signal.

DETAILED DESCRIPTION OF PREFERRED EMBODIMENTS

Hereunder, embodiments of the present invention will be explained in detail with reference to the accompanying drawings.

Figure 2:
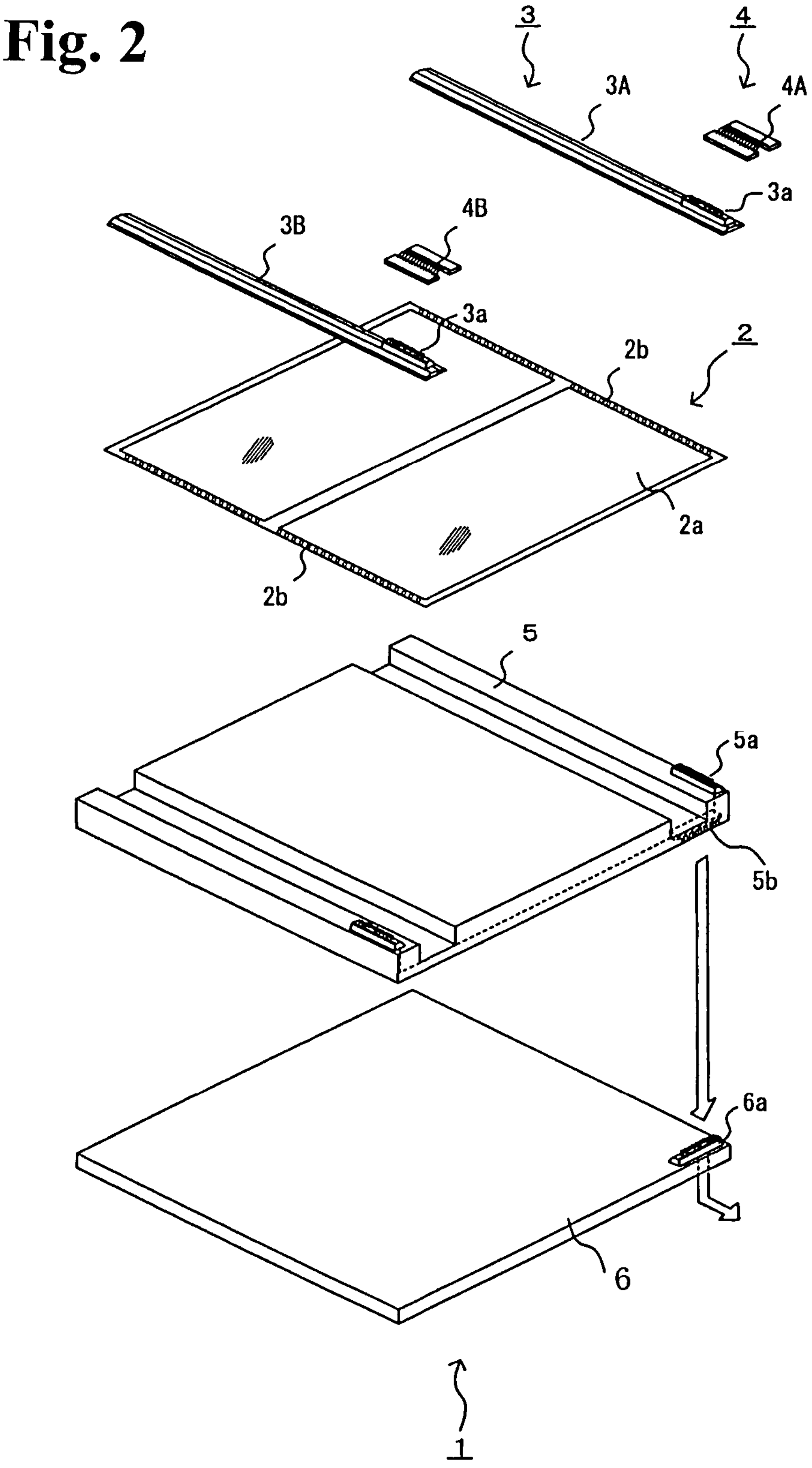
FIG. 2 is an exploded view showing structural components of the TFT array inspection device according to the embodiment of the present invention.
Figure 3A:
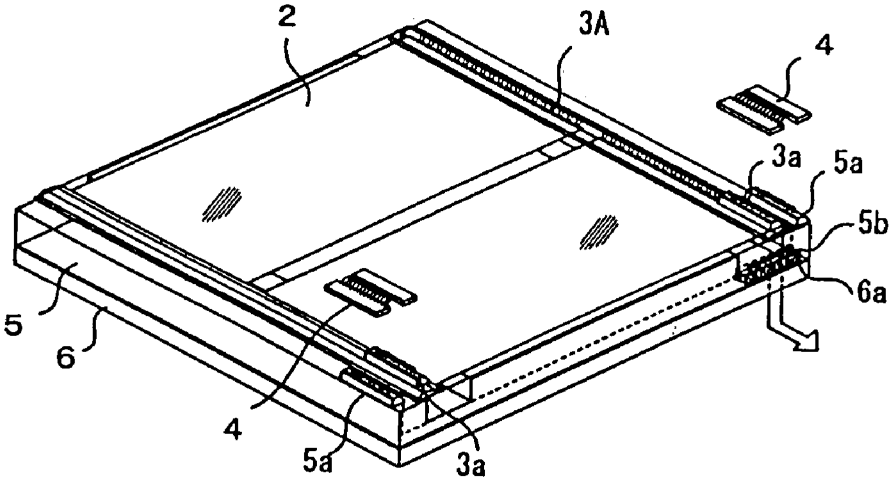
FIGS. 3(*a*) and 3(*b*) are views showing the TFT array inspection device according to the embodiment of the present invention, wherein FIG. 3(*a*) is a view showing a state before connecting means are attached, and FIG. 3(*b*) is a view showing a state that the connecting means are attached.
Figure 3B:
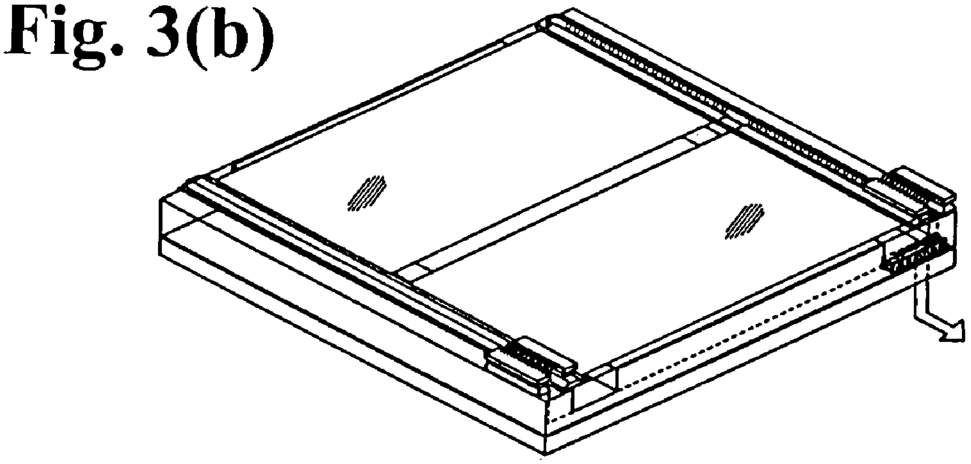
Figure 4A:
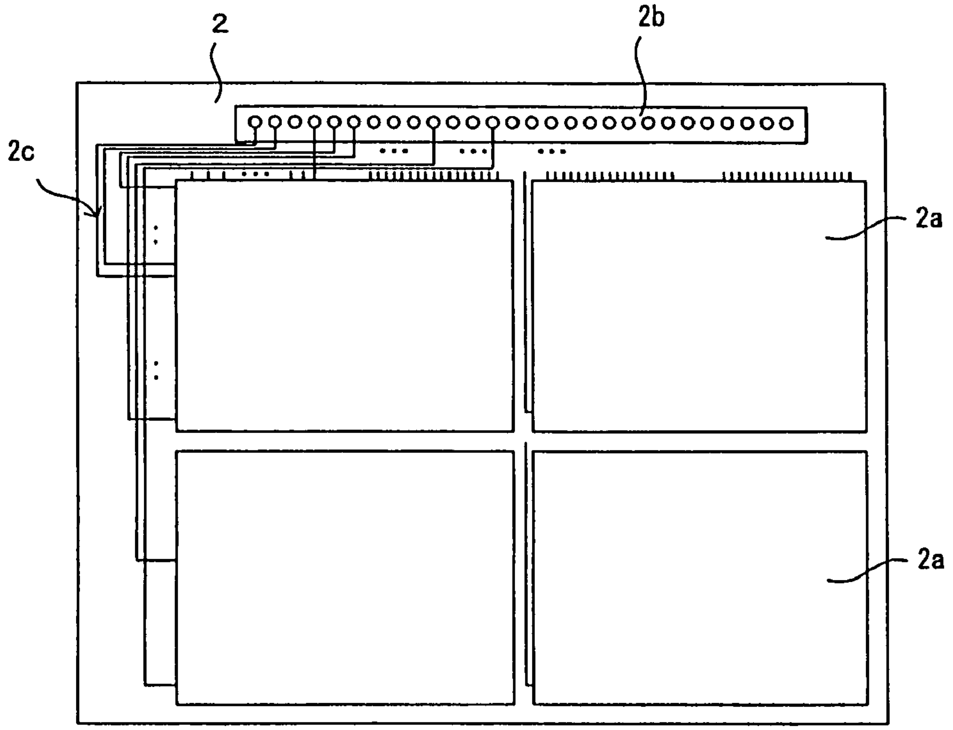
FIGS. 4(*a*) and 4(*b*) are plan views for explaining a TFT array substrate.
Figure 4B:
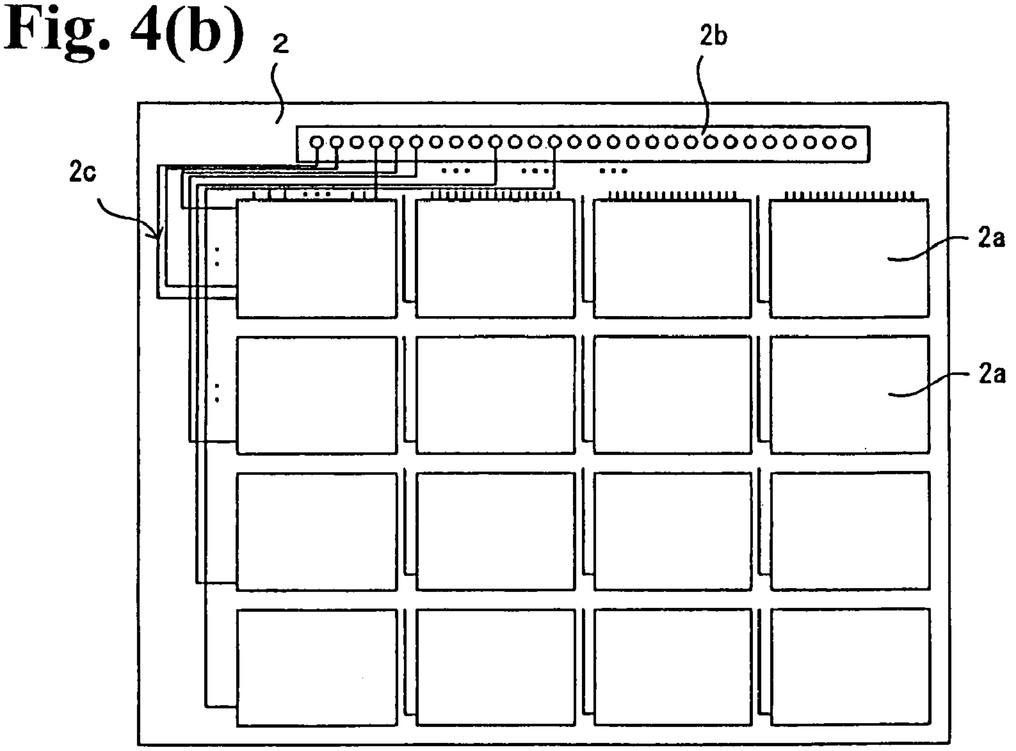

FIG. 2 is an exploded view showing structural components of a TFT array inspection device according to an embodiment of the present invention. FIGS. 3(*a*) and 3(*b*) are views showing the TFT array inspection device according to the embodiment of the present invention in a state that the TFT array inspection device is attached to TFT arrays. FIGS. 4(*a*) and 4(*b*) are plan views for explaining a TFT array substrate.

Figure 1:
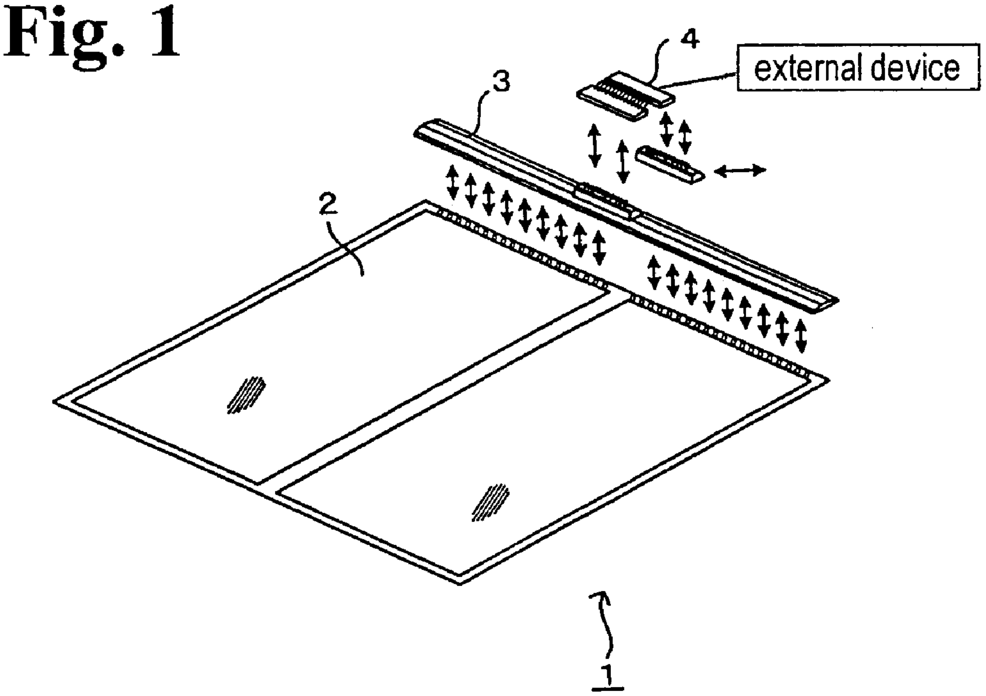
FIG. 1 is a view showing a TFT array inspection device according to an embodiment of the present invention.

In FIG. 1, a TFT array inspection device 1 inspects a TFT array substrate 2 with TFT arrays 2*a* formed thereon. A layout of the TFT arrays 2*a* formed on the TFT array substrate 2 is configured according to, for example, a size or specifications of a liquid crystal panel. FIGS. 4(*a*) and 4(*b*) show examples of the TFT array substrate 2. The TFT array 2*a* on the TFT array substrate 2 is provided with thin film transistors arranged in a matrix pattern and signal electrode terminals (for example, scanning signal electrode terminals and image signal electrode terminals) for driving the thin film transistors. The TFT array substrate 2 is provided with array inspection electrodes 2*b*. While the layout of the TFT array substrate is configured according to a size or specifications of each of the TFT arrays 2*a*, the array inspection electrodes 2*b* have a common layout and common electrode positions relative to a different layout.

The array inspection electrodes 2*b* are connected to each of the TFT arrays 2*a* through wires 2*c* with a pattern corresponding to each layout. Therefore, the array inspection electrodes 2*b* shown in FIG. 4(*a*) have an arrangement of pins same as that of the array inspection electrode 2*b* shown in FIG. 4(*b*) In the examples shown in FIGS. 4(*a*) and 4(*b*), the array inspection electrodes 2*b* are disposed along one side of the TFT array substrate 2. The array inspection electrodes 2*b* may be disposed along two opposing sides, orthogonal sides, or a combination thereof.

Hereinafter, the TFT array inspection device according to the embodiment of the present invention will be explained in a case that the array inspection electrodes 2*b* are disposed along two opposing sides of the TFT array substrate 2.

The TFT array inspection device 1 includes probe frames 3 (3A and 3B) and connecting means 4 (4A and 4B). In FIGS. 2, 3(*a*) and 3(*b*), the probe frames 3 have probe pins electrically connected to the array inspection electrodes 2*b* of the TFT array substrate 2, and the number and an arrangement of the probe pins correspond to the array inspection electrodes 2*b*.

As stated above, the array inspection electrodes 2*b* have a common arrangement relative to the TFT array substrate 2 with a different layout. Accordingly, the probe frames 3 electrically connected to the array inspection electrodes 2*b* can be used in common for the TFT array substrate 2 with a different layout. The probe frames 3 are provided with frame side connectors 3*a* connected to probe pins through wires in the probe frames for electrically connecting the connecting means 4.

When the array inspection electrode 2*b* disposed on one side of the TFT array substrate 2 has an arrangement different from that of the array inspection electrode 2*b* disposed on the other side, the corresponding probe frames 3A and 3B have different structures. The probe pins are provided on bottom surfaces of the probe frames 3, and are not shown in FIGS. 2, 3(*a*) and 3(*b*).

The connecting means 4 electrically connects between the probe frames 3 and an external device, and switches the electrical connection for connecting between the TFT array substrate with a different layout and the external device. The connecting means 4 switches the electrical connection through a structure using a switching connector or a switching element driven by an external signal. The connecting means 4 is connected to the frame side connectors 3*a* provided in the probe frames 3 to electrically connect the connecting means 4 to the probe frames 3.

The external device includes a power source (not shown) for supplying a driving signal to the TFT arrays 2*a* and an inspection device (not shown) for detecting an electric current in the TFT arrays 2*a* to inspect the arrays. The external device may include a component part electrically connecting with the inspection device. In the embodiment, the external device for electrically connecting with the power unit and the inspection device includes a pallet 5 and a stage 6.

The pallet 5 is a supporting member for supporting the TFT array substrate 2, and the stage 6 is a supporting member for supporting the pallet 5 to be freely movable. The pallet 5 is provided with grooves for inserting a part of a transport device for transporting the TFT array substrate 2. The pallet 5 includes pallet side connectors 5*a* electrically connected to the connecting means 4 for electrically connecting with the probe frames 3 through the connecting means 4, and also pallet side connectors 5*b* for electrically connecting with the stage 6. The pallet side connectors 5*a* are connected to the pallet side connectors 5*b* through wires provided in the pallet 5.

The stage 6 includes stage side connectors 6*a* electrically connected to the pallet side connectors 5*b* for electrically connecting with the pallet 5. The stage side connectors 6*a* can be connected to the power unit or the inspection device through a connector or a wire (not shown).

In addition, positions of the frame side connectors 3*a* on the probe frames 3 and positions of the pallet side connectors 5*a* on the pallet 5 are arranged such that the connecting means 4 are connected to the two connectors when the probe frames 3 are attached. Also, positions of the pallet side connectors 5*a* on the pallet 5 and positions of the stage side connectors 6*a* on the stage 6 are arranged such that the two connectors are connected when the pallet 5 is mounted on the stage 6.

In the structure described above, the pallet 5 with the TFT array substrate 2 mounted thereon is placed on the stage 6. The probe frames 3 are placed on the array inspection electrodes 2*b* of the TFT array substrate 2. The connecting means 4 are disposed on the frame side connectors 3*a* of the probe frames 3 and the pallet side connectors 5*a* of the pallet 5 side. Accordingly, the TFT array substrate 2 as an inspection subject is placed relative to the TFT array inspection device 1.

When the TFT array substrate 2 is placed, the stage 6 is electrically connected to the pallet 5 through the stage side connectors 6*a* and the pallet side connectors 5*b*, and the pallet 5 is electrically connected to the probe frames 3 through the connecting means 4 connecting between the pallet side connectors 5*a* and the frame side connectors 3*a*. Also, the probe frames 3 are electrically connected to the TFT array substrate 2 through the probe pins (not shown) of the probe frames 3 contacting the array inspection electrodes 2*b*.

When the TFT array substrate 2, i.e. the inspection subject, is changed, only the TFT array substrate 2 placed on the pallet 5 is changed and the probe frames 3 are continued to use without being changed. In addition, when the connection between the TFT array substrates and the external device is switched through the connecting means 4, it is possible to use the connecting means 4 provided with a wiring corresponding to the TFT array substrate 2 to be inspected next. When the connection between the TFT array substrates and the external device is switched through the switching element in the connecting means 4, it is not necessary to change the connecting means 4. In this case, it is possible to switch the connection of the switching element via the control signal, so that the connecting means 4 corresponds to the TFT array substrate 2 to be inspected next.

FIG. 3(*a*) is a view showing a state before the connecting means 4 are attached, and FIG. 3(*b*) is a view showing a state that the connecting means 4 are attached. In FIGS. 3(*a*) and 3(*b*), the probe frames 3A, i.e. one of the probe frames 3, is shown such that the array inspection electrodes 2*b* of the TFT array substrates 2 located under the probe frames 3A can be seen through.

Figure 5A:
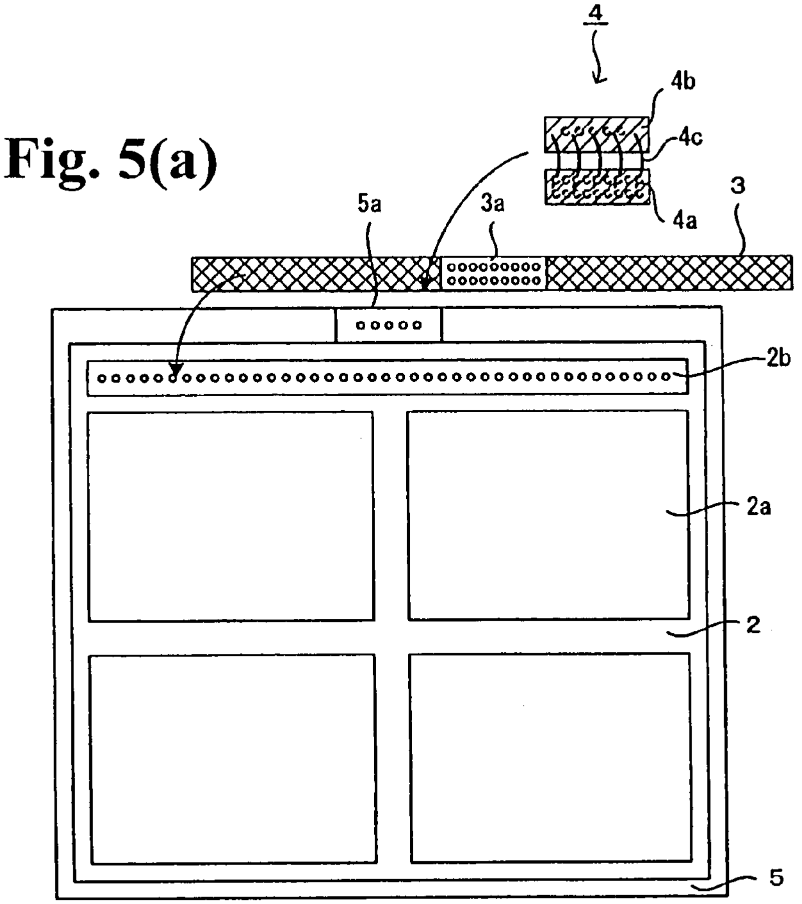
FIGS. 5(*a*) and 5(*b*) are views showing the TFT array substrate, a probe frame, the connecting means and a pallet.
Figure 5B:
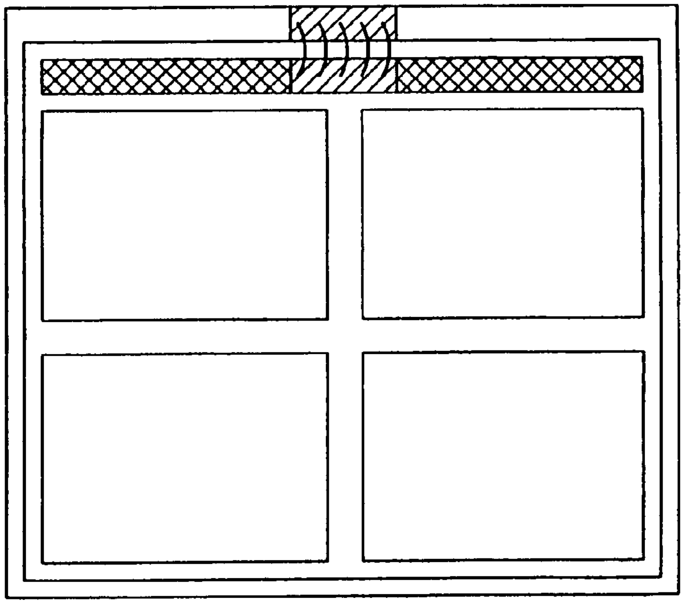
Figure 6A:
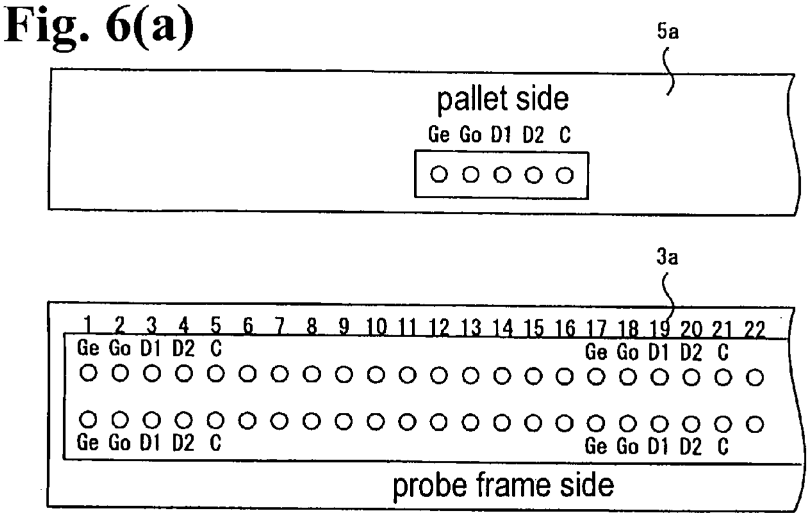
FIGS. 6(*a*) to 6(*c*) are schematic views for explaining a connection between the connecting means and the probe frame.
Figure 6B:
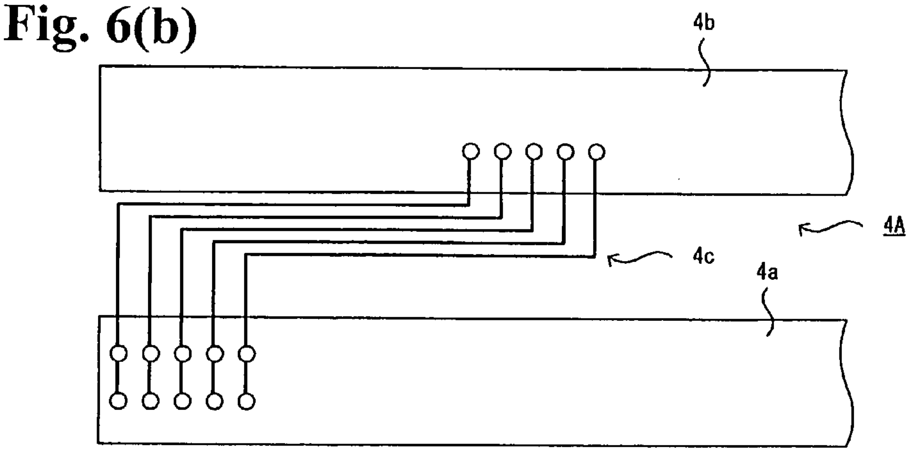
Figure 6C:
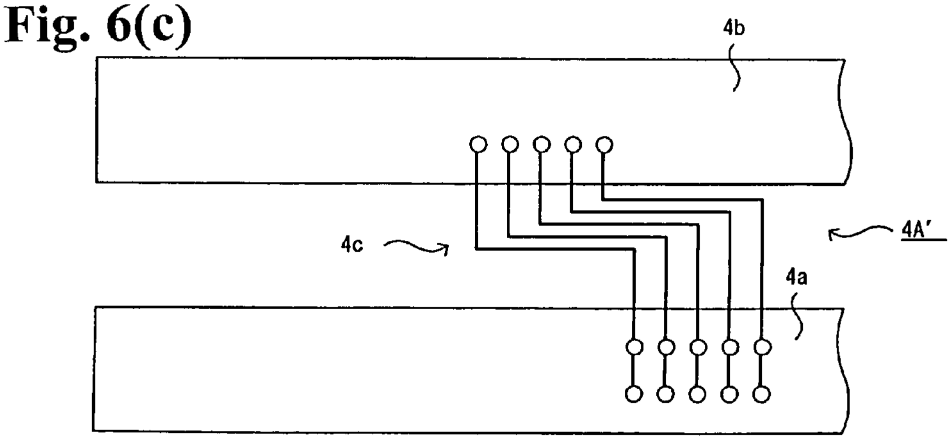

A process of connecting the TFT array substrates, the probe frames, and the connecting means will be explained with reference to FIGS. 5(*a*) through 8. FIGS. 5(*a*) and 5(*b*) are views showing the TFT array substrates, the probe frame, the connecting means and the pallet. FIGS. 6(*a*) to 7(*b*) are schematic views for explaining a connection between the connecting means and the probe frame.

In FIGS. 5(*a*) and 5(*b*), the array inspection electrode 2*b* with the common pattern regardless of the layout of the TFT array 2*a* is disposed on the TFT array substrate 2 placed on the pallet 5. The probe frame 3 is disposed on the TFT array substrate 2, so that the probe pins of the probe frame 3 contact the array inspection electrode 2*b*. The probe pins of the probe frame 3 are arranged in a pattern corresponding to the array inspection electrode 2*b*, so that the common single probe frame 3 can be used regardless of a layout of the TFT array substrate.

After the probe frame 3 is placed, the connecting means 4 is connected to the frame side connector 3*a* provided in the probe frame 3 and the pallet side connector 5*a* provided in the pallet 5. The connecting means 4 comprises a frame connector 4*a* connected to the frame side connector 3*a*; a pallet connector 4*b* connected to the pallet side connector 5*a*; and switching wires 4*c* connecting between the frame connector 4*a* and the pallet connector 4*b*. The switching wires 4*c* constitute the switching means for switching the connection between the frame connector 4*a* and the pallet connector 4*b*, so that the electrical connection between the TFT array substrate with the different layout and the external device is switched.

The connecting means is prepared beforehand according to the layout of the TFT array substrate, and the connecting means is selected according to the TFT array substrate to be inspected. Accordingly, it is possible to use a single probe frame even when the layout of the TFT array substrate is different.

FIG. 6(*a*) shows a relationship between the frame side connector 3*a* and the pallet side connector 5*a*. FIGS. 6(*b*) and 6(*c*) show configurations of the switching connectors 4A and 4A' with the switching wires 4*c* in different wiring patterns. The switching connector 4A is an example of the connecting means 4. When the switching connector 4A is changed, it is possible to switch the connection between the TFT array substrate side and the pallet side. In FIG. 6(*a*), among terminals of the frame side connector 3*a*, terminals 1 to 5 and 17 to 21 are connected to different terminals Ge, Go, D1, D2 and C of the TFT array substrate through the wirings at the TFT array substrate side, respectively.

When the terminals 1 to 5 are connected to the terminals Ge, Go, D1, D2 and C of the pallet connector 5*a*, the switching connector 4A shown in FIG. 6(*b*) is selected. The switching connector 4A comprises the switching wires 4*c* corresponding to the terminals 1 to 5. When the switching connector 4A is used, the terminals 1 to 5 are connected to the corresponding terminals of the pallet connector 5*a*. Similarly, when the terminals 17 to 22 are connected to the terminals Ge, Go, D1, D2 and C of the pallet connector 5*a*, the switching connector 4A' shown in FIG. 6(*c*) is selected. The connecting means 4 comprises the switching wires 4*c* corresponding to the terminals 17 to 22. When the switching connector 4A' is used, the terminals 17 and 21 are connected to the corresponding terminals of the pallet connector 5*a*.

Figure 7A:
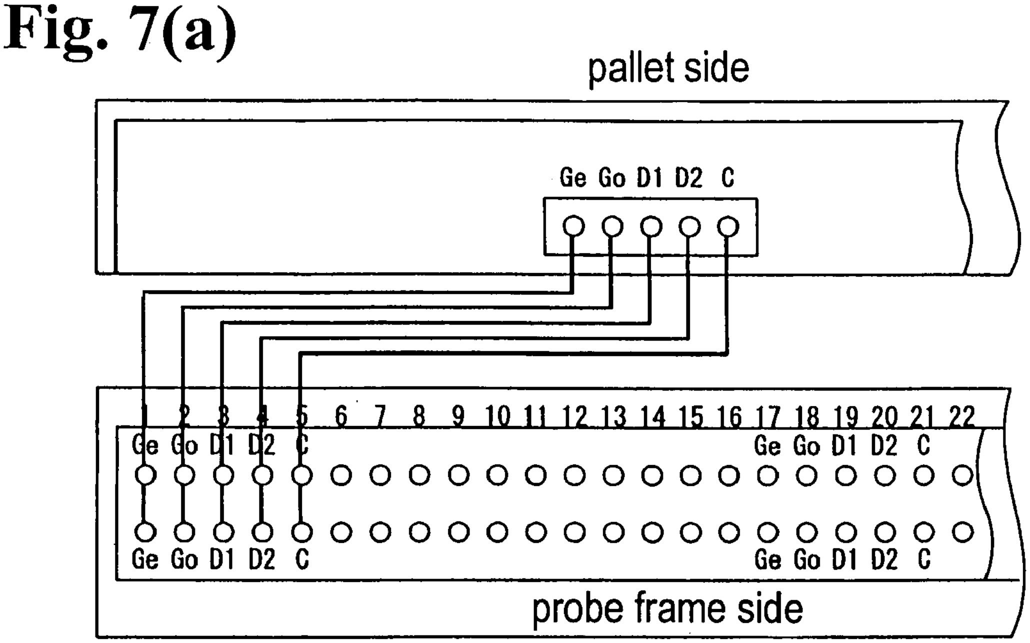
FIGS. 7(*a*) and 7(*b*) are schematic views for explaining a connection of a switching connector, wherein FIG. 7(*a*) shows a connected state in which the switching connector shown in FIG. 6(*b*) is used, and FIG. 7(*b*) shows a connected state in which the switching connector shown in FIG. 6(*c*) is used.
Figure 7B:
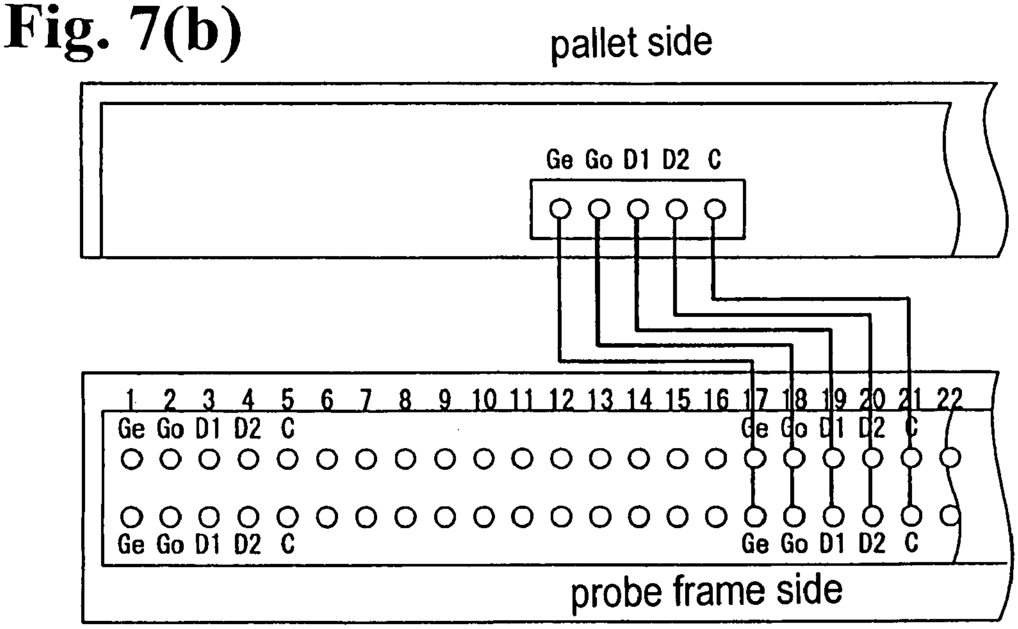

FIG. 7(*a*) shows the connected state in which the switching connector 4A shown in FIG. 6(*b*) is used, and FIG. 7(*b*) shows the connected state in which the switching connector 4A' shown in FIG. 6(*c*) is used.

Figure 8:
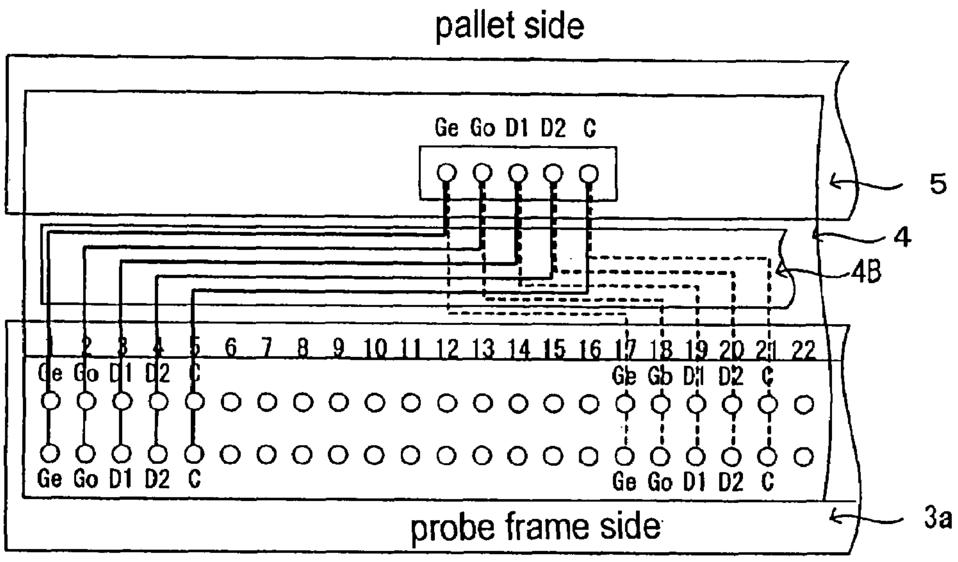
FIG. 8 is a schematic view for explaining a case when the connection of the connecting means is switched through an external signal.

It is possible to electrically switch the connection between the TFT array substrate and the pallet through the external signal other than physically changing the connecting means 4 as described above. FIG. 8 is a schematic view for explaining a case that the connecting means 4 switches the connection through the external signal. In FIG. 8, the connecting means 4 comprises the switching means 4B including the switching element. The switching element electrically switches the connection through the external signal (not shown). Accordingly, it is possible to switch the connection between the TFT array substrate side and the pallet side similar to the case shown in FIGS. 6(*a*) to 7(*b*).

Figure 9:
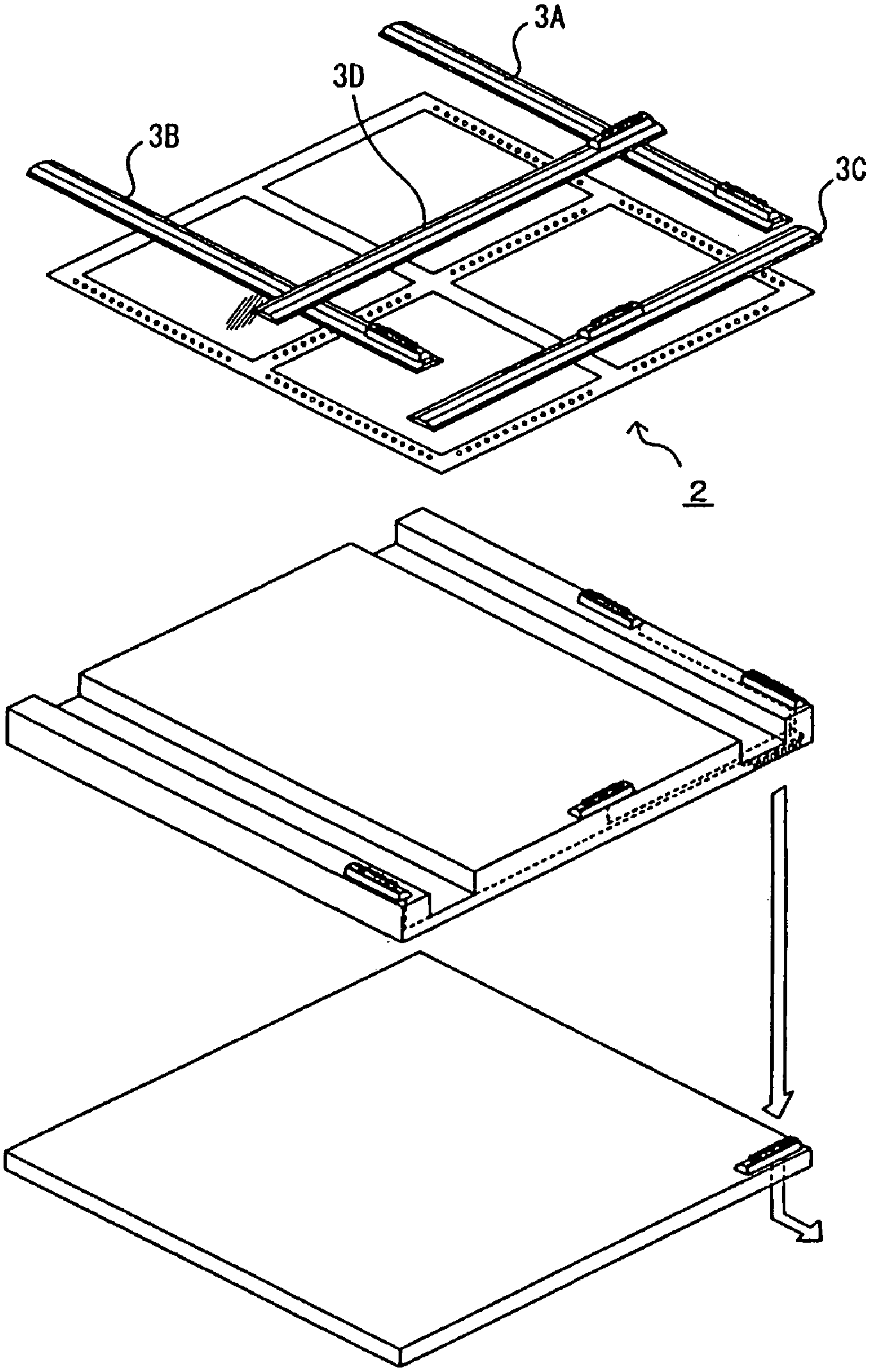
FIG. 9 is a view showing a modified example of the probe frames according to the present invention.
Figure 10:
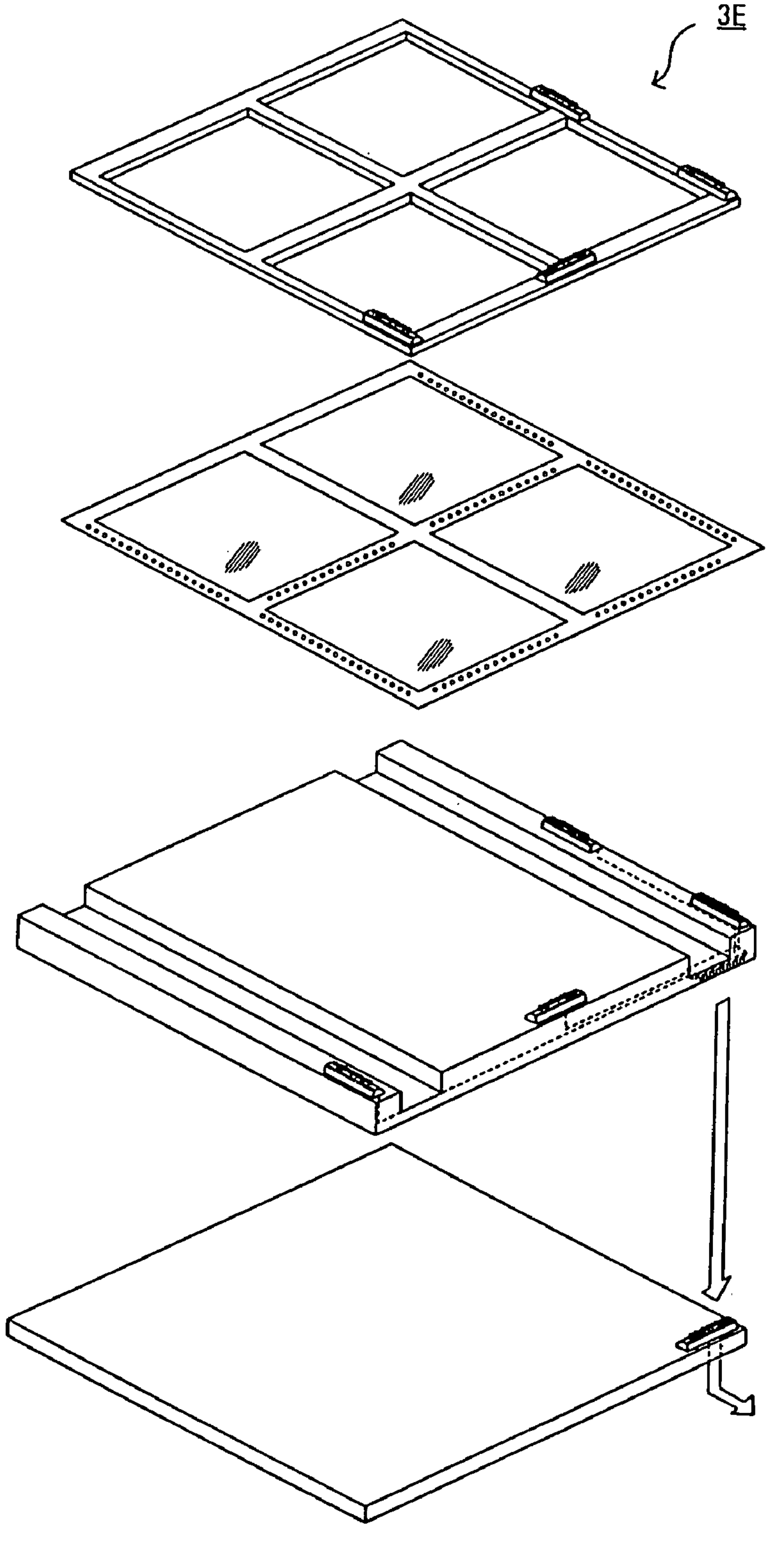
FIG. 10 is a view showing another modified example of the probe frames according to the present invention.
Figure 11:
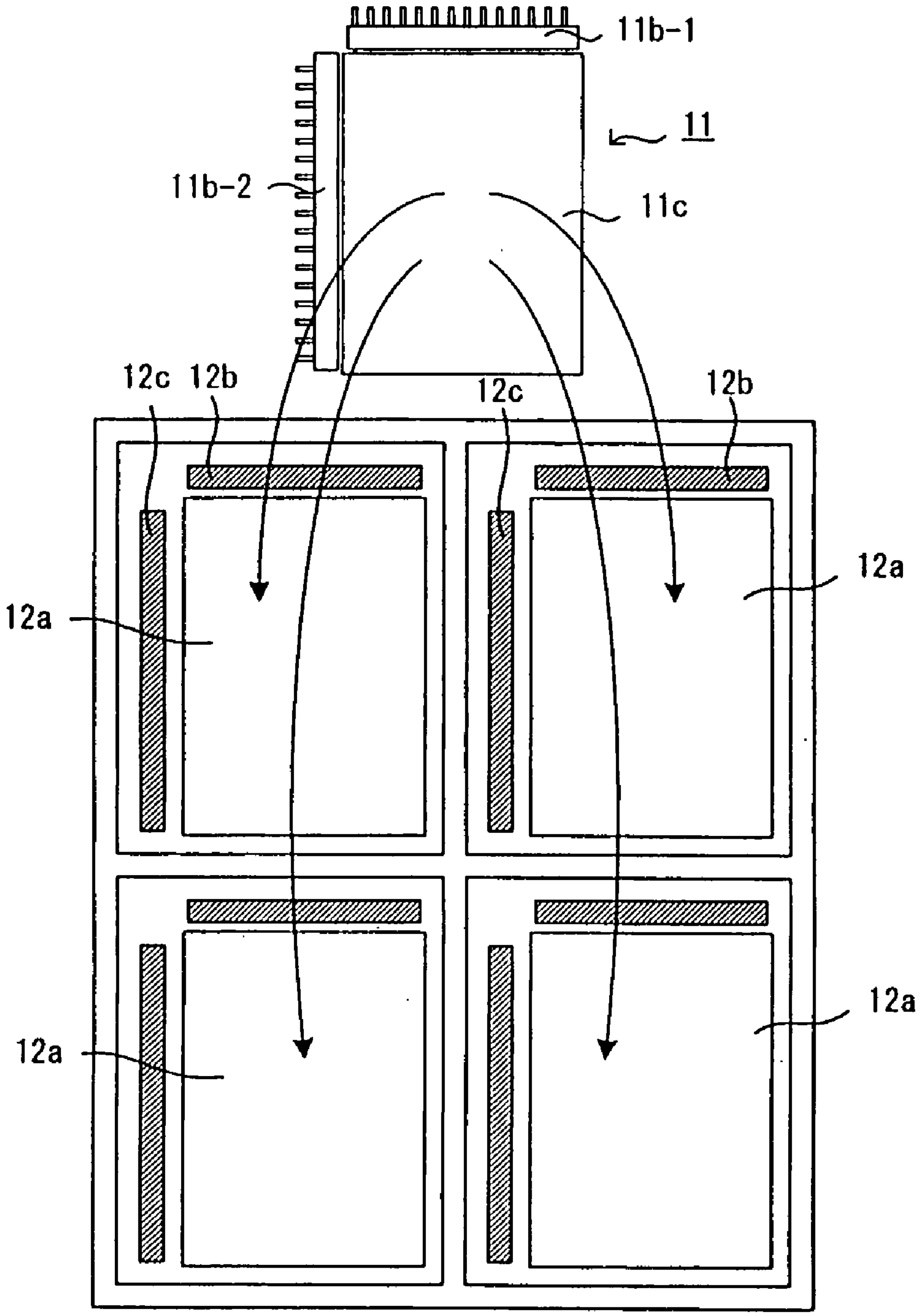
Fig. 11 Prior Art
FIG. 11 is a view showing the TFT array substrate and a conventional TFT array inspection device.

In the embodiments described above, the probe frames are disposed at one side or two opposing sides of the TFT array substrates. Alternatively, it is possible to dispose the probe frames at two orthogonal sides of the TFT array substrates or a combination thereof. FIGS. 9 and 10 are views for explaining other structural examples of the probe frames.

FIG. 9 is a view showing an example wherein the probe frames are disposed at two orthogonal positions on the TFT array substrate and at the positions crossing the TFT array substrate. The probe frames 3A and 3B are disposed at the two opposing sides relative to the TFT array substrate 2. A probe frame 3C is disposed at the position perpendicular to the sides. A probe frame 3D is disposed at the position crossing the TFT array substrate. FIG. 10 is a view showing a structural example wherein a probe frame 3E crosses a periphery of the TFT array substrate and the TFT array substrate. In the structure wherein the electrodes for the array inspection are formed inside the TFT array substrates, the probe frame crossing the TFT array substrate is used for connecting electrically.

In the TFT array inspection device according to the embodiments of the present invention, the connecting means can be manually exchanged. It is also possible to automatically exchange the connecting means with a configuration including a mechanism for holding the connecting means to be exchangeable, a mechanism for selecting the connecting means corresponding to the TFT array substrate among a plurality of the connecting means; and a mechanism for conveying the selected connecting means to be exchanged.

In the embodiments of the present invention, it is possible to use a common probe frame even with a different layout. When the layout is changed, it is easy to change the wiring by exchanging the connecting means. In the embodiments of the present invention, it is possible to use a common probe frame even with a different TFT array substrate. Accordingly, it is possible to reduce the running cost of the TFT array inspection device and the inspection process.

As described above, it is possible to use a common member without using a member corresponding to a different layout of the TFT array substrate.

While the invention has been explained with reference to the specific embodiments of the invention, the explanation is illustrative and the invention is limited only by the appended claims.

What is claimed is:

1. A TFT array inspection device for inspecting a TFT array substrate having a TFT array arranged in a matrix pattern and driving electrode terminals, comprising:
- array inspection electrodes disposed on the TFT array substrate and connected to the driving electrode terminals, said array inspection electrodes being arranged on said TFT array substrate commonly with other TFT array substrates regardless of layouts thereof,
- at least one probe frame electrically connected to the array inspection electrodes of the TFT array substrate,
- probe pins disposed on the at least one probe frame for contacting the array inspection electrodes, said probe pins being arranged to correspond to an arrangement of the array inspection electrodes of the TFT array substrate, and
- connecting means detachably attached to the at least one probe frame for connecting between the at least one probe frame and an external device, said connecting means having switching means for switching connections between the probe pins and the external device, said switching means including a connection switching connector having a wiring for connecting between the probe pins and the external device according to the layout of the TFT array substrate,
- wherein a plurality of connecting means different from each other, each having a wiring corresponding to the layout of the TFT array substrate to be inspected, is prepared, and the at least one probe frame is used commonly for the TFT array substrates with different layouts by selecting and changing to one of the plurality of connecting means.

2. A TFT array inspection device according to claim 1, further comprising a pallet for placing the TFT array substrate having a first connector connected to the connecting means, and a stage for placing the pallet having a second connector connected to the first connector and the external device.

3. A TFT array inspection device according to claim 1, wherein one probe frame and one connecting means are connected together to form a pair, and another probe frame and another connecting means for forming a pair are arranged to inspect one TFT array substrate.

4. A TFT array inspection device for inspecting a TFT array substrate having a TFT array arranged in a matrix pattern and driving electrode terminals, comprising:
- array inspection electrodes disposed on the TFT array substrate and connected to the driving electrode terminals, said array inspection electrodes being arranged on said TFT array substrate commonly with other TFT array substrates regardless of layouts thereof,
- at least one probe frame electrically connected to the array inspection electrodes of the TFT array substrate,
- probe pins disposed on the at least one probe frame for contacting the array inspection electrodes, said probe pins being arranged to correspond to an arrangement of the array inspection electrodes of the TFT array substrate, and
- connecting means detachably attached to the at least one probe frame for connecting between the at least one probe frame and an external device, said connecting means having switching means for switching connections between the probe pins and the external device,
- wherein said switching means includes a switching element for switching connections between the probe pins and the external device through an external control signal.

5. A TFT array inspection device according to claim 4, further comprising a pallet for placing the TFT array substrate having a first connector connected to the connecting means, and a stage for placing the pallet having a second connector connected to the first connector and the external device.

6. A TFT array inspection device according to claim 4, wherein one probe frame and one connecting means are connected together to form a pair, and another probe frame and another connecting means for forming a pair are arranged to inspect one TFT array substrate.

* * * * *